(12) United States Patent
Zhang et al.

(10) Patent No.: US 9,312,343 B2
(45) Date of Patent: Apr. 12, 2016

(54) TRANSISTORS WITH SEMICONDUCTOR INTERCONNECTION LAYERS AND SEMICONDUCTOR CHANNEL LAYERS OF DIFFERENT SEMICONDUCTOR MATERIALS

(75) Inventors: Qingchun Zhang, Cary, NC (US);
Sei-Hyung Ryu, Cary, NC (US); Anant K. Agarwal, Chapel Hill, NC (US);
Sarit Dhar, Cary, NC (US)

(73) Assignee: Cree, Inc., Durham, NC (US)

( * ) Notice: Subject to any disclaimer, the term of this patent is extended or adjusted under 35 U.S.C. 154(b) by 560 days.

(21) Appl. No.: 12/577,929

(22) Filed: Oct. 13, 2009

(65) Prior Publication Data

US 2011/0084284 A1    Apr. 14, 2011

(51) Int. Cl.
*H01L 29/267*  (2006.01)
*H01L 29/06*   (2006.01)
*H01L 29/66*   (2006.01)
(Continued)

(52) U.S. Cl.
CPC .......... *H01L 29/267* (2013.01); *H01L 29/0623* (2013.01); *H01L 29/0891* (2013.01); *H01L 29/66462* (2013.01); *H01L 29/7787* (2013.01); *H01L 29/7788* (2013.01); *H01L 29/7802* (2013.01); *H01L 29/7813* (2013.01); *H01L 29/04* (2013.01); *H01L 29/0696* (2013.01); *H01L 29/086* (2013.01); *H01L 29/0878* (2013.01);
(Continued)

(58) Field of Classification Search
CPC .............. H01L 29/267; H01L 29/0623; H01L 29/0891; H01L 29/66462; H01L 29/7787; H01L 29/7788; H01L 29/7802; H01L 29/7813

USPC .................................................. 257/E29.246
See application file for complete search history.

(56) References Cited

U.S. PATENT DOCUMENTS 4,946,547 A   8/1990  Palmour et al.
5,192,987 A   3/1993  Khan et al.
(Continued)

FOREIGN PATENT DOCUMENTS

JP    2004-327891 A   11/2004
JP    2006-140368 A    6/2006
JP    2006-286910 A   10/2006

OTHER PUBLICATIONS

Notification of Transmittal of the International Search Report and the Written Opinion of the International Searching Authority, or the Declaration, International Search Report, Written Opinion of the International Searching Authority, PCT/US 10/51758, Date of Mailing: Dec. 15, 2010; 11 pages.

(Continued)

*Primary Examiner* — Laura Menz
*Assistant Examiner* — Candice Y Chan
(74) *Attorney, Agent, or Firm* — Myers Bigel & Sibley, P.A.

(57) ABSTRACT

A transistor may include a semiconductor drift layer of a first semiconductor material and a semiconductor channel layer on the semiconductor drift layer. The semiconductor channel layer may include a second semiconductor material different than the first semiconductor material. A semiconductor interconnection layer may be electrically coupled between the semiconductor drift layer and the semiconductor channel layer, and the semiconductor interconnection layer may include a third semiconductor material different than the first and second semiconductor materials. In addition, a control electrode may be provided on the semiconductor channel layer.

41 Claims, 7 Drawing Sheets

(51) Int. Cl.
*H01L 29/778* (2006.01)
*H01L 29/78* (2006.01)
*H01L 29/04* (2006.01)
*H01L 29/08* (2006.01)
*H01L 29/20* (2006.01)
*H01L 29/423* (2006.01)

(52) U.S. Cl.
CPC ....... *H01L 29/2003* (2013.01); *H01L 29/42368* (2013.01)

(56) References Cited

U.S. PATENT DOCUMENTS

| | | | |
|---|---|---|---|
| 5,200,022 A | 4/1993 | Kong et al. | |
| 5,210,051 A | 5/1993 | Carter, Jr. | |
| 5,218,216 A * | 6/1993 | Manabe et al. | 257/103 |
| 5,292,501 A | 3/1994 | Degenhardt et al. | |
| 5,296,395 A | 3/1994 | Khan et al. | |
| RE34,861 E | 2/1995 | Davis et al. | |
| 5,393,993 A | 2/1995 | Edmond et al. | |
| 5,523,589 A | 6/1996 | Edmond et al. | |
| 5,976,936 A * | 11/1999 | Miyajima et al. | 438/268 |
| 6,316,793 B1 | 11/2001 | Sheppard et al. | |
| 6,548,333 B2 | 4/2003 | Smith | |
| 7,084,441 B2 * | 8/2006 | Saxler | 257/243 |
| 7,544,963 B2 | 6/2009 | Saxler | |
| 7,548,112 B2 | 6/2009 | Sheppard | |
| 7,768,066 B2 * | 8/2010 | Onose et al. | 257/330 |
| 2002/0048302 A1 * | 4/2002 | Kimura | 372/46 |
| 2005/0181536 A1 * | 8/2005 | Tsuji | 438/105 |
| 2006/0219997 A1 | 10/2006 | Kawasaki et al. | |
| 2006/0244010 A1 | 11/2006 | Saxler | |
| 2007/0164321 A1 | 7/2007 | Sheppard et al. | |
| 2008/0128862 A1 | 6/2008 | Sugimoto et al. | |
| 2009/0090966 A1 | 4/2009 | Thorup et al. | |
| 2009/0134434 A1 | 5/2009 | Werner et al. | |
| 2009/0218621 A1 | 9/2009 | Pfirsch et al. | |
| 2010/0019279 A1 | 1/2010 | Chen et al. | |

OTHER PUBLICATIONS

International Preliminary Report on Patentability Corresponding to International Application No. PCT/US2010/051758; Date of Mailing: Apr. 26, 2012; 9 pages.

Japanese Office Action Corresponding to Japanese Patent Application No. 2012-534236; Dispatched on Dec. 18, 2013; Foreign Text, 4 Pages; English Translation Thereof, 4 Pages.

* cited by examiner

TRANSISTORS WITH SEMICONDUCTOR INTERCONNECTION LAYERS AND SEMICONDUCTOR CHANNEL LAYERS OF DIFFERENT SEMICONDUCTOR MATERIALS

BACKGROUND

The present invention relates to electronic devices, and more particularly to transistor structures.

Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN. HEMTs in the GaN/AlGaN system have been demonstrated. U.S. Pat. Nos. 5,192,987 and 5,296,395 describe AlGaN/GaN HEMT structures and methods of manufacture, the disclosures of which are incorporated herein by reference. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

SUMMARY

According to some embodiments of the present invention, a transistor may include a semiconductor drift layer of a first semiconductor material and a semiconductor channel layer on the semiconductor drift layer. The semiconductor channel layer may include a second semiconductor material different than the first semiconductor material. A semiconductor interconnection layer may be electrically coupled between the semiconductor drift layer and the semiconductor channel layer, with the semiconductor interconnection layer including a third semiconductor material different than the first and second semiconductor materials, and a control electrode (e.g., a gate electrode) may be on the semiconductor channel layer. Moreover, the semiconductor drift and interconnection layers may have a same conductivity type.

The third semiconductor material may include a polycrystalline semiconductor material, such as polysilicon. The first semiconductor material may include silicon carbide, and the second semiconductor material may include a group III nitride, such as gallium nitride. The first and second semiconductor materials may be substantially single crystal semiconductor materials.

The semiconductor drift and interconnection layers may have a first conductivity type. In addition, a semiconductor blocking region may be provided between the semiconductor channel and drift layers with the semiconductor blocking region having a second conductivity type different than the first conductivity type. Moreover, the semiconductor drift layer and blocking region may include the first semiconductor material (e.g., silicon carbide).

The semiconductor channel layer may include a stack of semiconductor layers defining a heterojunction to provide a two dimensional electron gas (2DEG) with the semiconductor channel layer between the control electrode and the drift layer. Moreover, the control electrode may be configured to modulate a conductivity of the two dimensional electron gas responsive to an electrical signal applied to the control electrode. The stack of semiconductor layers, for example, may include a layer of aluminum gallium nitride sandwiched between two layers of gallium nitride.

The semiconductor drift and interconnection layers may have a first conductivity type, and the semiconductor channel layer may include first, second, and third semiconductor layers. The first and third semiconductor layers may have the first conductivity type, and the second semiconductor layer may have a second conductivity type different than the first conductivity type. The second semiconductor layer may be between the first and third semiconductor layers, and the first semiconductor layer may be between the second semiconductor layer and the semiconductor drift layer. The first semiconductor layer may be electrically coupled to the semiconductor interconnection layer, the control electrode may be adjacent an edge of the second semiconductor layer, and the control electrode may be configured to modulate a conductivity of the second semiconductor layer responsive to an electrical signal applied to the control electrode.

The semiconductor drift and interconnection layers may have a first conductivity type. The channel layer may include a bulk region having a second conductivity type different than the first conductivity type and first and second spaced apart contact regions having the first conductivity type. The second contact region may be electrically coupled to the semiconductor interconnection layer, and the control electrode may be adjacent the bulk region between the first and second contact regions. The control electrode may be configured to modulate a conductivity of the bulk region responsive to an electrical signal applied to the control electrode.

The semiconductor channel layer may include a highly doped contact region electrically coupled to the semiconductor interconnection layer. The highly doped contact region, the semiconductor interconnection layer, and the semiconductor drift layer may have a same conductivity type.

The semiconductor drift and interconnection layers may have a same conductivity type. In addition, a semiconductor contact region of the first semiconductor material may be between the semiconductor drift and interconnection layers. Moreover, the semiconductor drift layer, the semiconductor interconnection layer, and the semiconductor contact region may have a same conductivity type, and a dopant concentration of the semiconductor contact region may be greater than a dopant concentration of the semiconductor drift layer.

A first controlled electrode (e.g., a first source/drain electrode) may be electrically coupled to a portion of the semiconductor channel layer spaced apart from the semiconductor interconnection layer. A second controlled electrode (e.g., a second source/drain electrode) may be electrically coupled to the semiconductor drift layer opposite the semiconductor channel layer so that the semiconductor drift layer is between the first and second controlled electrodes. Moreover, the control electrode may be configured to modulate an electrical conductivity of the channel layer responsive to an electrical signal applied to the control electrode to thereby modulate an electrical conductivity between the first and second controlled regions.

According to other embodiments of the present invention, a transistor may include a semiconductor drift layer of a first semiconductor material and having a first conductivity type and a semiconductor blocking region on the semiconductor drift layer with the semiconductor blocking region having a second conductivity type different than the first conductivity type. A semiconductor channel layer on the semiconductor blocking region may include a second semiconductor material different than the first semiconductor material with the semiconductor blocking region between the semiconductor drift and channel layers. A semiconductor interconnection layer may be electrically connected between the semiconductor drift layer and the semiconductor channel layer. More particularly, the semiconductor interconnection layer may include a third semiconductor material different than the first and second semiconductor materials, and the semiconductor interconnection layer may have the first conductivity type. A first controlled electrode (e.g., a first source/drain electrode) may be electrically coupled to a portion of the semiconductor channel layer spaced apart from the semiconductor interconnection layer. A second controlled electrode (e.g., a second source/drain electrode) may be electrically coupled to the semiconductor drift layer opposite the semiconductor channel layer so that the semiconductor drift layer is between the first and second controlled electrodes. A control electrode (e.g., a gate electrode) may be provided on the semiconductor channel layer between the first controlled electrode and the semiconductor interconnection layer with the control electrode being configured to modulate an electrical conductivity of the channel layer responsive to an electrical signal applied to the control electrode.

The third semiconductor material may include a polycrystalline semiconductor material such as polysilicon. The first semiconductor material may include silicon carbide, and the second semiconductor material may include a group III nitride such as gallium nitride. The first and second semiconductor materials may be substantially single crystal semiconductor materials, and the semiconductor blocking region may include the first semiconductor material.

The semiconductor channel layer may include a stack of semiconductor layers defining a heterojunction to provide a two dimensional electron gas (2DEG). Moreover, the control electrode may be configured to modulate a conductivity of the two dimensional electron gas responsive to an electrical signal applied to the control electrode. The semiconductor channel layer, for example, may include a layer of aluminum gallium nitride sandwiched between two layers of gallium nitride.

The semiconductor drift and interconnection layers may have a first conductivity type, and the semiconductor channel layer may include first, second, and third semiconductor layers. The first and third semiconductor layers may have the first conductivity type, and the second semiconductor layer may have a second conductivity type different than the first conductivity type, wherein the second semiconductor layer is between the first and third semiconductor layers, wherein the first semiconductor layer is between the second semiconductor layer and the semiconductor drift layer, and wherein the first semiconductor layer is electrically coupled to the semiconductor interconnection layer. The control electrode may be configured to modulate a conductivity of the second semiconductor layer responsive to an electrical signal applied to the control electrode.

The channel layer may include a bulk region having the second conductivity type and first and second spaced apart contact regions having the first conductivity type. The second contact region may be electrically coupled to the semiconductor interconnection layer, and the control electrode may be configured to modulate a conductivity of the bulk region responsive to an electrical signal applied to the control electrode.

The semiconductor channel layer may include a highly doped contact region electrically coupled to the semiconductor interconnection layer, and the highly doped contact region may have the first conductivity type. In addition, a semiconductor contact region of the first semiconductor material may be between the semiconductor drift and interconnection layers. The semiconductor contact region may have the first conductivity type, and a dopant concentration of the semiconductor contact region may be greater than a dopant concentration of the semiconductor drift layer.

According to still other embodiments of the present invention, a transistor may include a silicon carbide drift layer and a group III nitride channel layer on the silicon carbide drift layer. A first controlled electrode (e.g., a first source/drain electrode) may be electrically coupled to a portion of the group III channel layer, and a second controlled electrode (e.g., a second source/drain electrode) may be electrically coupled to the silicon carbide drift layer opposite the group III channel layer so that the silicon carbide drift layer is between the first and second controlled electrodes. In addition, a control electrode (e.g., a gate electrode) may be provided on the group III channel layer. The control electrode may be configured to modulate an electrical conductivity of the channel layer responsive to an electrical signal applied to the control electrode.

The silicon carbide drift layer may have a first conductivity type. A semiconductor blocking region may be between the silicon carbide drift layer and the group III nitride channel layer, and the semiconductor blocking region may have a second conductivity type different than the first conductivity type. A semiconductor interconnection layer may be electrically connected between the silicon carbide drift layer and the group III nitride channel layer. The semiconductor interconnection layer may include a semiconductor material different than the group III nitride of the channel layer and different than silicon carbide, and the semiconductor interconnection layer may have the first conductivity type. The semiconductor blocking region may include a silicon carbide blocking region, and the semiconductor material may include a polycrystalline semiconductor material such as polysilicon.

DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1A:
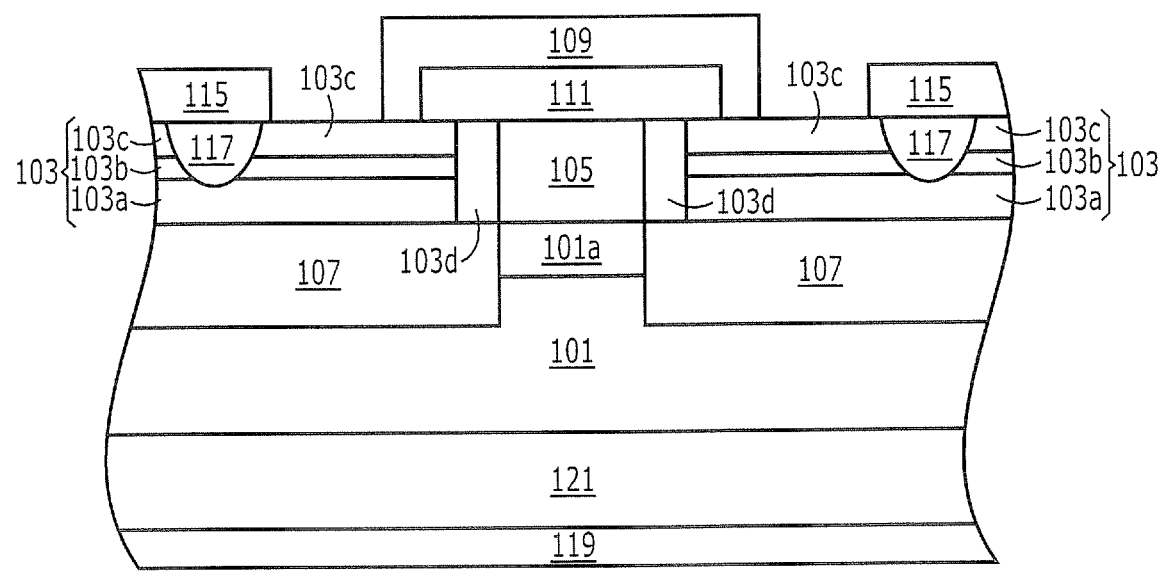
FIGS. 1A and 1B are respective cross sectional and plan views illustrating a unit cell of a field effect transistor according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in $N^+$, $N^-$, $P+$, $P^-$, $N^{++}$, $N^{--}$, $P^{++}$, $P^{--}$, or the like), to indicate a relatively larger ("+") or smaller ("−") concentration of majority carriers compared to another layer or region. However, such notation does not imply the existence of a particular concentration of majority or minority carriers in a layer or region.

Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree Research, Inc., of Durham, N.C., the assignee of the present invention, and the methods for producing such substrates are set forth in the scientific literature as well as in a number of commonly assigned U.S. patents, including but not limited to U.S. Pat. No. Re. 34,861, U.S. Pat. No. 4,946,547, and U.S. Pat. No. 5,200,022, the disclosures of which are incorporated herein in their entirety by reference.

As used herein, the term "Group III nitride" refers to those semiconducting compounds formed between nitrogen and the elements in Group III of the periodic table, usually aluminum (Al), gallium (Ga), and indium (In). The term also refers to ternary and tertiary compounds such as AlGaN and AlInGaN. The Group III elements can combine with nitrogen to form binary (e.g., GaN), ternary (e.g., AlGaN), and tertiary (e.g., AlInGaN) compounds. These compounds all have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature, and in commonly assigned U.S. Pat. No. 5,210,051, U.S. Pat. No. 5,393,993, U.S. Pat. No. 5,523,589, and U.S. Pat. No. 5,292,501, the disclosures of which are hereby incorporated herein in their entirety by reference.

Power switching devices, such as Metal Oxide Semiconductor Field Effect Transistors (MOSFETS) and/or Insulated Gate Bipolar Transistors, may have relatively low channel mobility resulting in relatively high on resistance, relatively low transconductance, and/or relatively low switching speeds. A gallium nitride (GaN) High Electron Mobility Transistor (HEMT) may provide a relatively high channel mobility through a two dimensional electron gas (2DEG), but a lateral structure of such a device may provide a relatively low power handling capacity. According to some embodiments of the present invention, vertical power switching devices may be provided with a channel formed of a group III nitride material(s) (e.g., GaN) on a different semiconductor material, such as silicon carbide (SiC), to provide relatively high voltage blocking and relatively low channel resistance. More particularly, a relatively thick SiC epitaxial layer may provide blocking of relatively high reverse voltages, and a group III nitride channel (e.g., a GaN HEMT channel, a GaN MOS channel, etc.) may provide relatively high channel mobility.

Figure 1B:
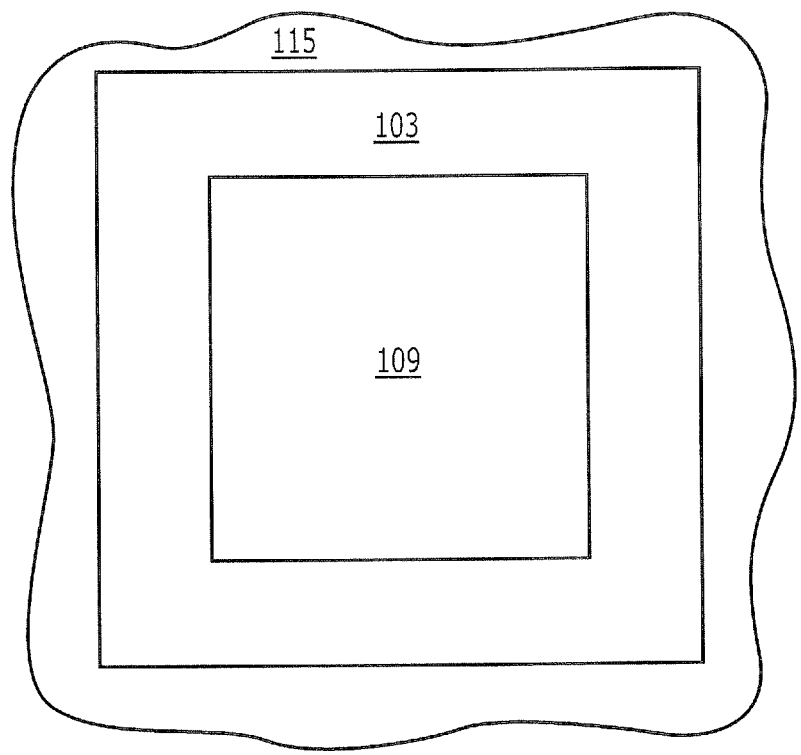

According to embodiments of the present invention illustrated in FIGS. 1A and 1B, a vertical HEMT power switching device may include a semiconductor drift layer 101 of a first semiconductor material and a semiconductor channel layer 103 of a second semiconductor material on the semiconductor drift layer 101, with the first and second semiconductor materials being different. For example, semiconductor drift layer 101 may be an epitaxially formed substantially single crystal N type SiC drift layer, and semiconductor channel layer 103 may be a stack of epitaxially formed substantially single crystal group III nitride semiconductor layers 103a, 103b, and 103c providing a two dimensional electron gas (2DEG) adjacent an interface between semiconductor layers 103b and 103c. More particularly, an aluminum gallium nitride (AlGaN) layer 103b may be sandwiched between gallium nitride (GaN) layers 103a and 103c to provide the two dimensional electron gas. Use of group III nitride material stacks (such as GaN/AlGaN/GaN stacks) to provide a channel layer with a two dimensional electron gas is discussed, for example, in U.S. Pat. No. 7,548,112 entitled "Switch Mode Power Amplifier Using MIS-HEMT With Field Plate Extension"; U.S. Pat. No. 6,548,333 entitled "Aluminum Gallium Nitride/Gallium Nitride High Electron Mobility Transistors Having A Gate Contact On a Gallium Nitride Based Cap Segment"; U.S. Pat. No. 7,544,963 entitled "Binary Group III-nitride Based High Electron Mobility Transistors"; U.S. Publication No. 2006/0244010 entitled "Aluminum Free Group III-nitride Based High Electron Mobility Transistors And Methods Of Fabricating Same"; and U.S. Publication No. 2007/0164321 entitled "Methods Of Fabricating Transistors Including Supported Gate Electrodes And Related Devices". The disclosures of each of the above referenced patents and publications are hereby incorporated herein in their entirety by reference.

In addition, a semiconductor interconnection layer 105 of a third semiconductor material, such as N type polycrystalline silicon (polysilicon), may be electrically coupled between semiconductor drift layer 101 and semiconductor channel layer 103. Highly doped $N^+$ type contact regions 103d of semiconductor channel layer 103 may enhance electrical coupling between semiconductor channel layer 103 and semiconductor interconnection layer 105. Similarly, highly doped $N^+$ type contact region 101a of semiconductor drift layer 101 may enhance electrical coupling between semiconductor drift layer 101 and semiconductor interconnection layer 105. Accordingly, a dopant concentration of contact region 101a may be significantly greater than a dopant concentration of semiconductor drift layer 101.

Semiconductor drift and interconnection layers 101 and 105 and semiconductor channel layer 103 may have a same conductivity type (e.g., N type). In addition, a semiconductor blocking region 107 may be provided between semiconductor drift and channel layers 101 and 103, and semiconductor blocking region 107 may have a conductivity type (e.g., P type) opposite that of semiconductor drift and interconnection layers 101 and 105. For example, semiconductor drift and interconnection layers 101 and 105 may have N type conductivity, and semiconductor blocking region 107 may have P type conductivity. More particularly, semiconductor blocking region 107 may be a highly doped $P^+$ type layer of silicon carbide. By way of example, N type semiconductor drift layer 101 may be provided as a surface portion of an SiC substrate and/or as an eptaxially formed SiC layer, and highly doped $N^+$ type contact region 101a and highly doped $P^+$ type semiconductor blocking region 107 may be formed by doping (e.g., implanting) portions of the SiC substrate/layer including drift layer 101 with respective N and P type dopants. Semiconductor drift layer 101, semiconductor blocking region 107, and highly doped $N^+$ type contact region 101a may thus all be formed in an SiC layer(s)/substrate(s).

A gate electrode 109 (e.g., a metal and/or polysilicon gate electrode) may be provided on semiconductor channel layer 103 opposite semiconductor drift layer 101 to modulate a conductivity of the two dimensional electron gas responsive to an electrical signal applied to gate electrode 109. In addition, an insulating layer 111 (such as a silicon oxide layer and/or a silicon nitride layer) may provide electrical isolation between gate electrode 109 and semiconductor interconnection layer 105 and between gate electrode 109 and N+ type contact regions 103d. Gate electrode structures used to modulate conductivity of a two dimensional electron gas are discussed, for example, in U.S. Pat. No. 7,548,112, U.S. Pat. No. 6,548,333, U.S. Pat. No. 7,544,963, U.S. Publication No. 2006/0244010, and U.S. Publication No. 2007/0164321, the disclosures of which are hereby incorporated herein in their entirety by reference. The transistor of FIGS. 1A and 1B may be normally on, and a negative bias may be applied to gate electrode 109 to deplete the two dimensional electron gas of channel layer 103 to thereby turn off the transistor. As further shown in FIGS. 1A and 1B, a gate dielectric layer is not required between gate electrode 109 and semiconductor channel layer 103 because a Schottky junction and/or a non-ohmic contact may be provided between gate electrode 109 and semiconductor channel layer 103. According to other embodiments of the present invention, a thin gate dielectric layer may be provided between gate electrode 109 and semiconductor channel layer 103.

Source/drain electrodes 115 (e.g., metal electrodes) may be provided on semiconductor channel layer 103 (spaced apart from gate electrode 109), and relatively highly doped $N^+$ source contact regions 117 may provide ohmic contact between source/drain electrodes 115 and the two dimensional electron gas (adjacent the interface between layers 103$b$ and 103$c$). In addition, source/drain electrode 119 (e.g., a metal electrode) may be provided on semiconductor drift layer 101 opposite source/drain electrodes 115 so that a vertical conduction path is defined between source/drain electrodes 115 and source/drain electrode 119. Accordingly, an electrical signal applied to gate electrode 109 may be used to modulate an electrical conductivity and thus an electrical current between source/drain electrodes 115 and source/drain electrodes 119.

In addition, a highly doped. $N^+$ type semiconductor contact layer 121 may be provided between semiconductor drift layer 101 and source/drain electrode 119 to provide ohmic contact with source/drain electrode 119. Contact layer 121 may be formed by doping (e.g., implanting) dopants into a back side of SiC drift layer 101. According to other embodiments of the present invention, $N^+$ type semiconductor contact layer 121 may be an N+ type SiC substrate, and drift layer 101 may be epitaxially formed on contact layer 121. According to other embodiments of the present invention, contact layer 121 may be a highly doped $P^+$ type semiconductor layer.

In an N-channel device as discussed above (with N type conductivity channel layer 103, interconnection layer 105, and drift layer 101), for example, electrodes 115 may be source electrodes, and electrode 119 may be a drain electrode. Moreover, a positive voltage may be applied to drain electrode 119 and source electrodes 115 may be grounded. By grounding gate electrode 109, an electrical current may flow from drain electrode 119 through SiC semiconductor layers 121, 101, 101$a$, through polysilicon interconnection layer 105, through group III nitride channel layer 103, and through contact regions 117 to source electrodes 115. By providing a sufficiently negative bias to gate electrode 109, portions of channel layer 103 (including the two dimensional electron gas) adjacent to and/or in contact with gate electrode 109 may be depleted thereby blocking the path of electrical current between drain electrode 119 and source electrodes 115. Semiconductor blocking region 107 (having P type conductivity) may provide an increased capacity for voltage blocking when the transistor is turned off. An increasing magnitude of a positive voltage applied to drain electrode 119, for example, may result in increased depletion of a reverse biased P-N junction between N type drift layer 101 and P type blocking region 107. While an N channel device is discussed by way of example, opposite conductivity types of the semiconductor layers may be used to provide a P channel device with electrodes 115 being drain electrodes and with electrode 119 being a source electrode.

As discussed above, silicon carbide semiconductor layers 121, 101, 107, and 101$a$ may be formed using epitaxial deposition on and/or doping (e.g., implanting) of an SiC substrate/layer. Moreover, any substrate used during fabrication may be partially removed or totally removed so that only epitaxially formed layers of SiC and/or group III nitride(s) remain. Semiconductor group III nitride channel layer 103 may be formed using epitaxial deposition on the silicon carbide layers, and patterned to expose portions of contact region 101$a$. Highly doped $N^+$ type polysilicon interconnection layer 105 may be formed on exposed portions of contact region 101$a$. Highly doped $N^+$ type contact regions 103$d$ and/or 117 may be formed by doping (e.g., implanting) channel layer 103 before patterning channel layer 103, after forming interconnection layer 105, or between patterning channel layer 103 and forming interconnection layer 105. Insulating layer 111, gate electrode 109, and source/drain electrodes 115 and 119 may then be formed. According to other embodiments of the present invention, polysilicon interconnection layer 105 may be formed before forming channel layer 103.

By using highly doped $N^+$ type polysilicon for interconnection layer 105, an ohmic contact may be provided between group III nitride channel layer 103 and SiC drift layer 101. Such a polysilicon interconnection layer 105 may thus be formed in the middle of the process without creating significant contamination and/or without degrading during subsequent thermal processes/operations. Stated in other words, polysilicon interconnection layer 105 may be compatible with subsequent operations used to form channel layer 103, contact regions 103$d$ and/or 117, insulating layer 111, gate electrode 109, and/or source drain electrodes 115 and/or 119. According to other embodiments of the present invention, interconnection layer 105 may be a metal interconnection layer formed after forming channel layer 103 and contact regions 117.

Figure 2A:
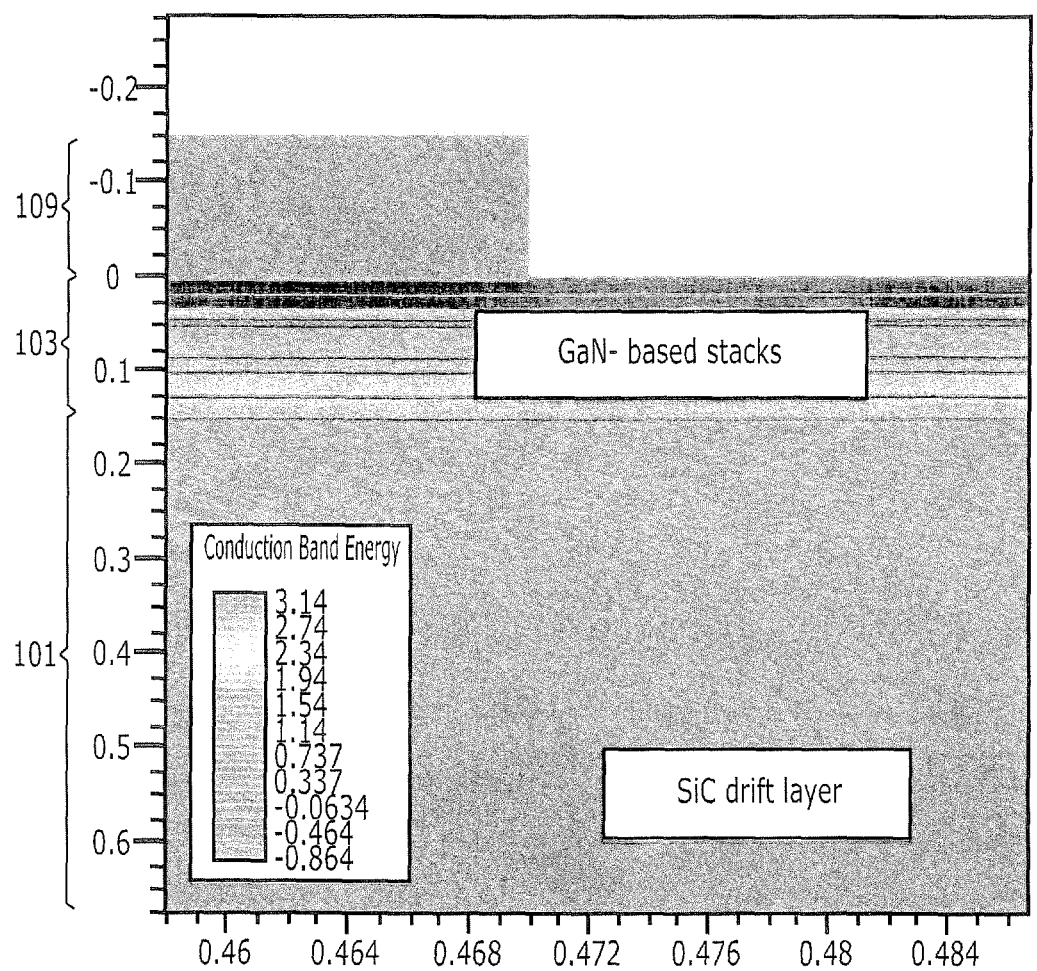
FIG. 2A illustrates conduction band energies of a channel layer comprising a gallium nitride based stack providing a two dimensional electron gas on a silicon carbide drift layer.

FIG. 2A illustrates conduction band energies of a channel layer 103 (comprising a group III nitride based stack) providing a two dimensional electron gas on a silicon carbide drift layer 101 as discussed above with respect to FIGS. 1A and 1B. Semiconductor blocking region 107 is not shown in FIG. 2A because semiconductor blocking region 107 does not significantly influence operation during forward conduction.

Figure 2B:
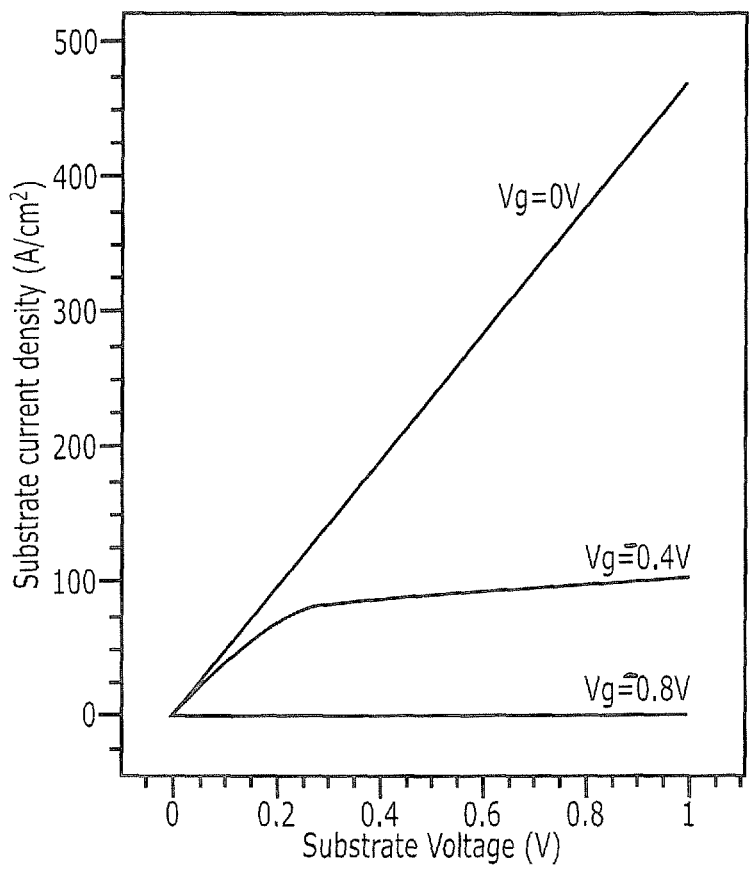
FIG. 2B is a graph illustrating simulated output characteristics of a field effect transistor of FIGS. 1A, 1B, and 2A.

FIG. 2B is a graph illustrating simulated output characteristics of the field effect transistor of FIGS. 1A, 1B, and 2A (with channel layer 103 including an N type GaN based stack providing a 2DEG on N type SiC drift layer 101). With a gate voltage of 0V (i.e., with a bias of 0V applied to gate 109) and with a source voltage of 0V (i.e., with electrodes 115 grounded), current between electrodes 119 and 115 may be linearly proportional with respect to a substrate voltage (i.e., a voltage applied to electrode 119). With increasingly negative gate voltages, currents between electrodes 119 and 115 may be reduced. At a gate voltage of −0.4 volts, currents between electrodes 119 and 115 may be significantly reduced, and at a gate voltage of −0.8 volts, currents between electrodes 119 and 115 may be substantially turned off. In the simulation of FIG. 2B, SiC drift layer 101 is N type with a doping concentration of approximately $6 \times 10^{15}$ cm$^{-3}$, and gate electrode 109 is a Schottky type metal gate electrode in direct contact with channel layer 103 with a gate length of 120 nm.

Figure 2C:
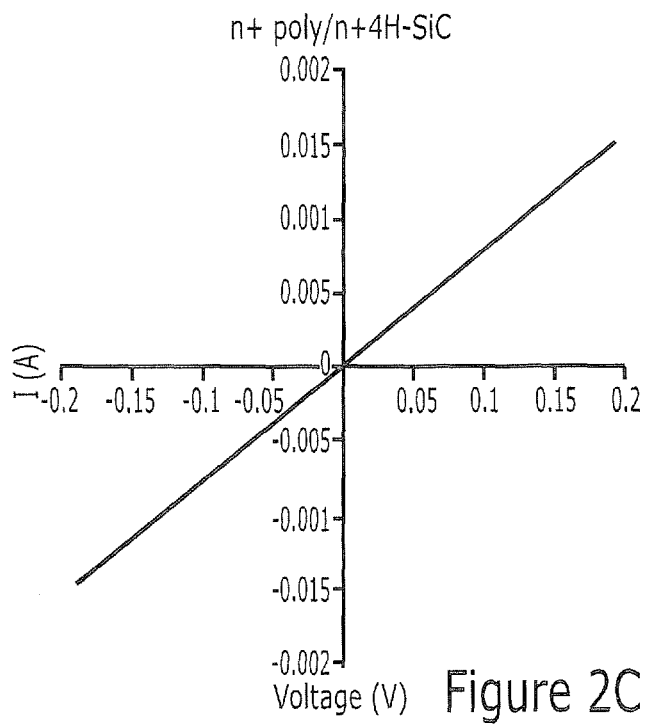
FIG. 2C is a graph illustrating current/voltage characteristics of a junction between N type doped polysilicon and N type silicon carbide (simulating a junction between a polysilicon interconnection layer and contact region of SiC drift layer)

FIG. 2C is a graph illustrating current/voltage characteristics of a junction between N type doped polysilicon and N type silicon carbide (simulating a junction between polysilicon interconnection layer 105 and contact region 101a of SiC drift layer 101). As shown in FIG. 2C, an ohmic contact may be provided.

Figure 2D:
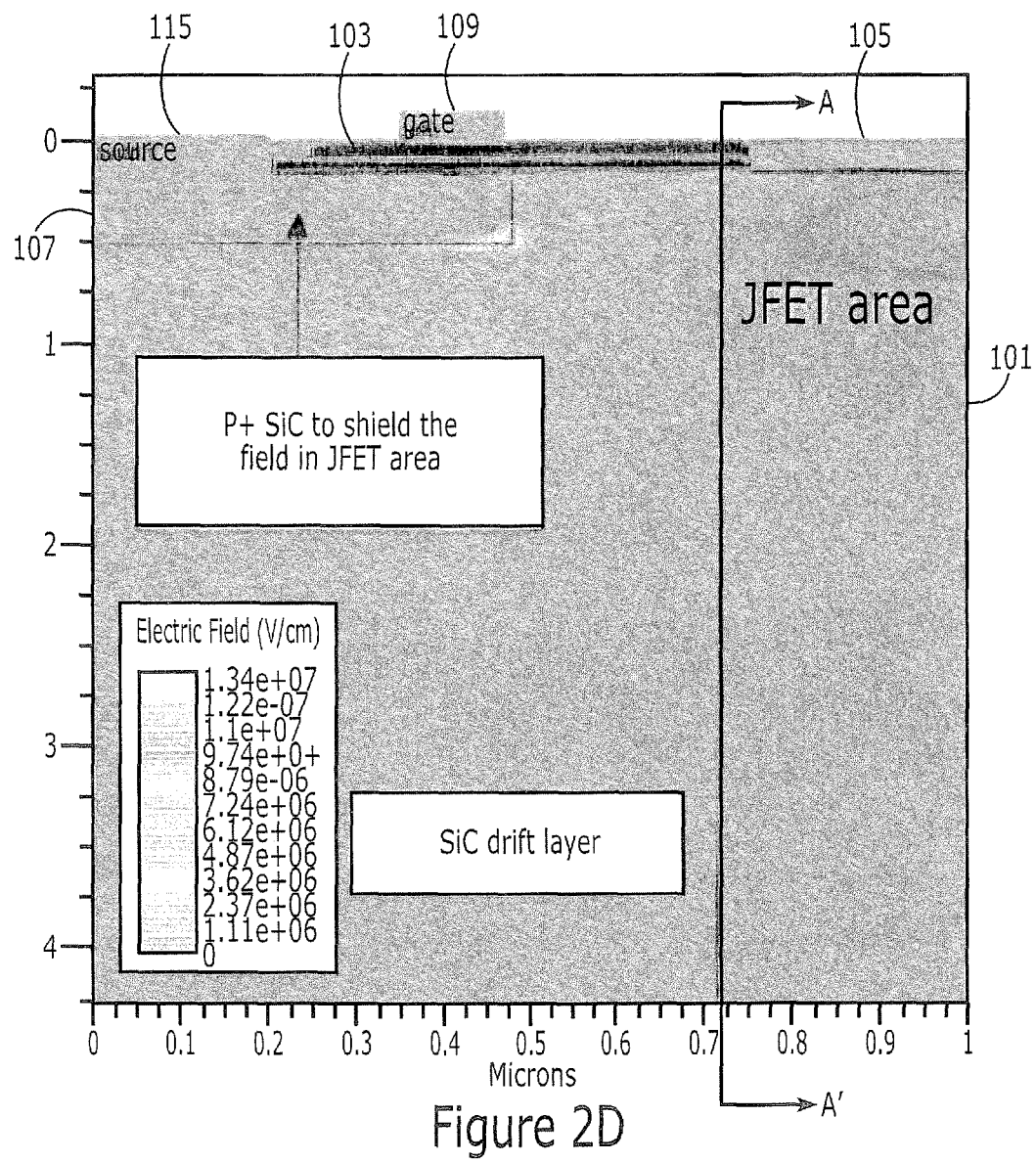
FIG. 2D illustrates simulated electrical field contours through a device structure according to FIGS. 1A and 1B at a 1200 volt reverse bias.
Figure 2E:
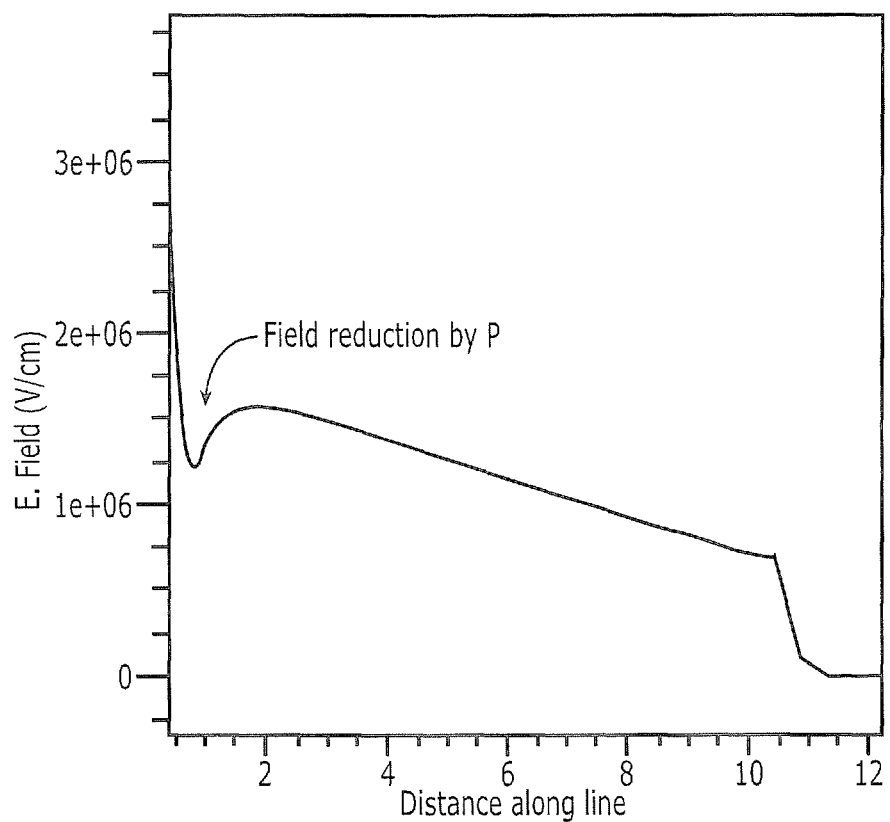
FIG. 2E is a graph illustrating a distribution of electrical fields taken along section line A-A' of FIG. 2D.

As discussed above with respect to FIGS. 1A and 1B, P type blocking region 107 may support blocking of relatively high voltages between electrodes 119 and 115 when the device is turned off. FIG. 2D illustrates simulated electrical field contours through a device structure according to FIGS. 1A and 1B at a 1200 volt reverse bias. FIG. 2E is a graph illustrating a distribution of electrical fields taken along section line A-A' of FIG. 2D. As shown in FIG. 2E, an electrical field may be reduced at an interface between polysilicon interconnection layer 105 and silicon carbide drift layer 101 at relatively high reverse bias.

Figure 3A:
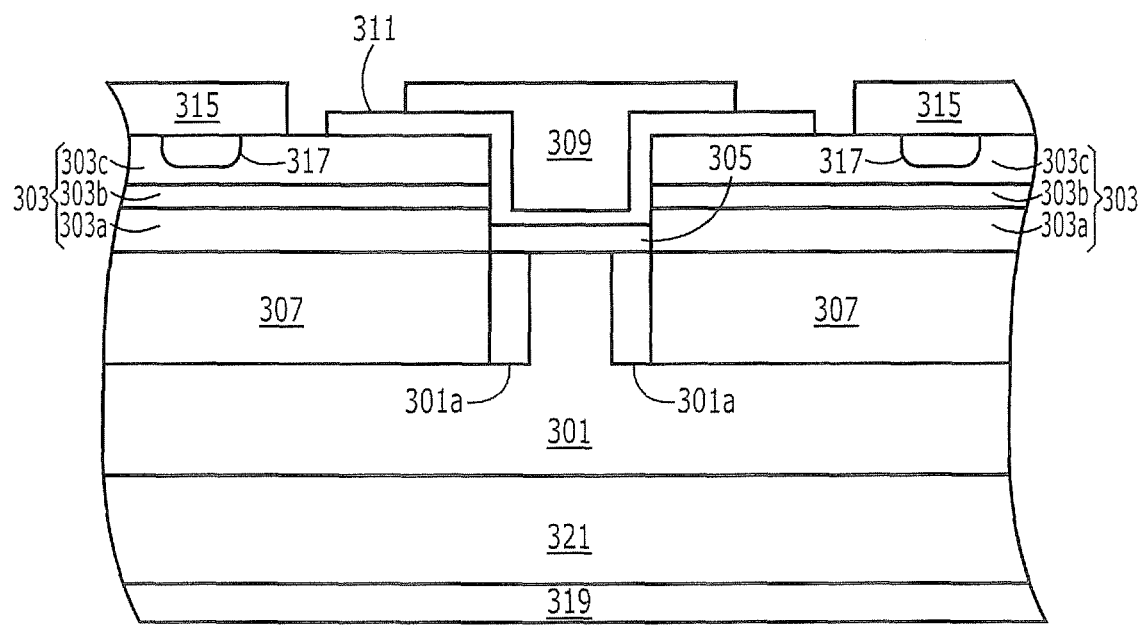
FIGS. 3A and 3B are respective cross sectional and plan views illustrating a unit cell of a field effect transistor according to some other embodiments of the present invention.
Figure 3B:
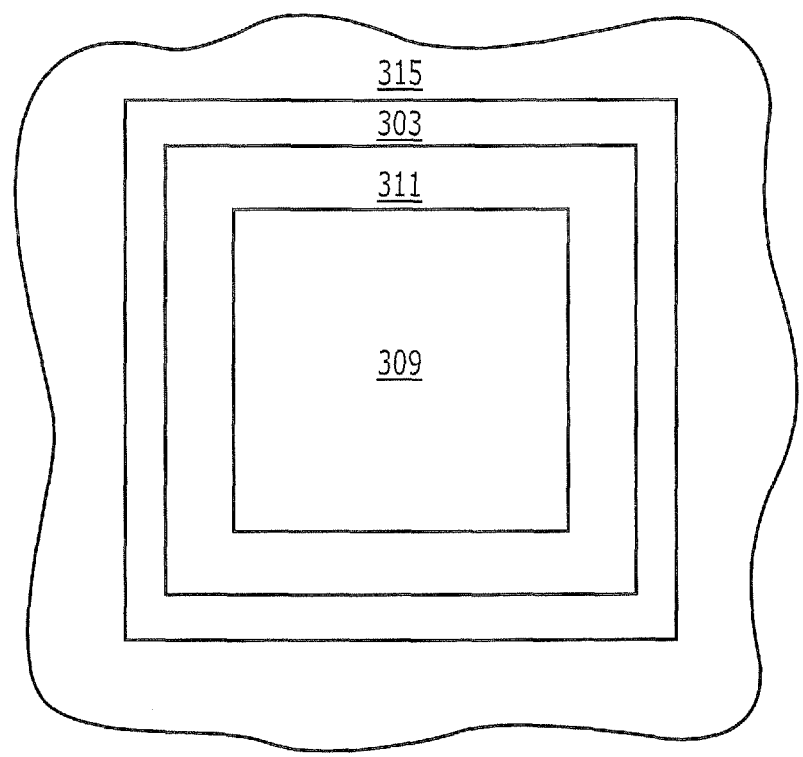

According to embodiments of the present invention illustrated in FIGS. 3A and 3B, a vertical power switching device may include a semiconductor drift layer 301 of a first semiconductor material and a semiconductor channel layer 303 of a second semiconductor material on the semiconductor drift layer 301, with the first and second semiconductor materials being different. For example, semiconductor drift layer 301 may be an epitaxially formed substantially single crystal N type SiC drift layer, and semiconductor channel layer 303 may be a stack of epitaxially formed substantially single crystal group III nitride semiconductor layers 303a, 303b, and 303c with semiconductor layer 303b having a conductivity type opposite that of semiconductor layers 303a and 303c. According to some embodiments, semiconductor layers 303a and 303c may be N type gallium nitride layers, and semiconductor layer 303b may be a P type gallium nitride layer. For example, semiconductor layer 303a may be a relatively highly doped $N^+$ type conductivity GaN layer, and semiconductor layer 303c may be a relatively lightly doped $N^-$ type conductivity GaN layer with relatively highly doped $N^+$ type conductivity contact regions 317 providing ohmic contact with source/drain electrodes 315 (e.g., metal electrodes). In alternatives, semiconductor layer 303a may be a relatively lightly doped $N^-$ type conductivity GaN layer with a relatively highly doped $N^+$ type conductivity contact region adjacent semiconductor interconnection layer 305, and/or semiconductor layer 303c may be a relatively highly doped $N^+$ type conductivity GaN layer so that separate contact regions 317 may not be required.

Semiconductor interconnection layer 305 may be a layer of a third semiconductor material, such as N type polycrystalline silicon (polysilicon), electrically coupled between semiconductor drift layer 301 and semiconductor layer 303a. Highly doped $N^+$ type contact region 301a of semiconductor drift layer 301 may enhance electrical coupling between SiC semiconductor drift layer 301 and polysilicon interconnection layer 305. Accordingly, a dopant concentration of contact region 301a may be significantly greater than a dopant concentration of semiconductor drift layer 301. As shown in FIGS. 3A and 3B, portions of semiconductor drift layer 301 may extend between portions of contact region 301a to contact interconnection layer 305. According to other embodiments of the present invention, contact region 301a and blocking regions 307 may completely separate drift layer 301 and interconnection layer 305.

Semiconductor drift and interconnection layers 301 and 305 and semiconductor layers 303a and 303c may have a same conductivity type (e.g., N type for an N channel device). In addition, a semiconductor blocking region 307 may be provided between semiconductor drift and channel layers 301 and 303. Moreover, semiconductor blocking region 307 and semiconductor layer 303b may have a conductivity type (e.g., P type for an N channel device) opposite that of semiconductor drift layer 301, semiconductor interconnection layer 305, and semiconductor layers 303a and 303b. For example, semiconductor drift layer 301, interconnection layer 305, and semiconductor layers 303a and 303c may have N type conductivity, and semiconductor blocking region 307 and semiconductor layer 303b may have P type conductivity. More particularly, semiconductor blocking region 307 may be a highly doped $P^+$ type layer of silicon carbide. By way of example, N type semiconductor drift layer 301 may be provided as a surface portion of an SiC substrate and/or as an eptaxially formed SiC layer, and highly doped $N^+$ type contact region 301a and highly doped $P^+$ type semiconductor blocking region 307 may be formed by doping (e.g., implanting) portions of the SiC substrate/layer including drift layer 301 with respective N and P type dopants. Semiconductor drift layer 301, semiconductor blocking region 307, and highly doped $N^+$ type contact region 301a may thus all be formed in an SiC layer(s)/substrate(s).

A relatively thin gate insulating layer 311 (e.g., a silicon oxide layer, a silicon nitride layer, etc.) may be provided on semiconductor interconnection layer 305, along exposed edges of channel layer 303, and on surface portions of channel layer 303 opposite semiconductor drift layer 301. A gate electrode 309 (e.g., a metal and/or doped polysilicon electrode) may be provided on gate insulating layer 311 opposite channel layer 303. More particularly, gate insulating layer 311 and gate electrode 309 may be provided adjacent P type semiconductor layer 303b to modulate a conductivity through the P type semiconductor layer 303b between N type semiconductor layers 303a and 303c responsive to an electrical signal applied to gate electrode 309. The transistor of FIGS. 3A and 3B may be normally off, and a positive bias may be applied to gate electrode 309 to generate an N type conductivity channel along an edge of P type semiconductor layer 303b (adjacent gate electrode 309) between N type semiconductor layers 303a and 303c to thereby turn the transistor on. P type semiconductor layer 303b may thus serve as a channel region between N type semiconductor layers 303a and 303c serving as source/drain regions of a UMOS (U-type Metal Oxide Semiconductor) transistor structure.

Source/drain electrodes 315 (e.g., metal electrodes) may be provided on semiconductor channel layer 303 (spaced apart from gate electrode 309), and relatively highly doped $N^+$ source contact regions 317 may provide ohmic contact between source/drain electrodes 315 and N type semiconductor layer 303c. In addition, source/drain electrode 319 (e.g., metal electrode) may be provided on semiconductor drift layer 301 opposite source/drain electrodes 315 so that a vertical conduction path is defined between source/drain electrodes 315 and source/drain electrode 319. Accordingly, an electrical signal applied to gate electrode 309 may be used to modulate an electrical conductivity and thus an electrical current between source/drain electrodes 315 and source/drain electrodes 319.

In addition, a highly doped $N^+$ type semiconductor contact layer 321 may be provided between semiconductor drift layer 301 and source/drain electrode 319 to provide ohmic contact with source/drain electrode 319. Contact layer 321 may be formed by doping (e.g., implanting) dopants into a back side of SiC drift layer 301. According to other embodiments of the present invention, $N^+$ type semiconductor contact layer 321 may be an N+ type SiC substrate, and drift layer 301 may be epitaxially formed on contact layer 321. According to other embodiments of the present invention, contact layer 321 may be a highly doped $P^+$ type semiconductor layer.

In an N-channel device as discussed above (with N type conductivity semiconductor layers 303a and 303c, interconnection layer 305, and drift layer 301), for example, electrodes 315 may be source electrodes, and electrode 319 may be a drain electrode. Moreover, a positive voltage may be applied to drain electrode 319 and source electrodes 315 may be grounded. By applying a positive bias to gate electrode 309, an electrical current may flow from drain electrode 319 through SiC semiconductor layers 321, 301, 301a, through polysilicon interconnection layer 305, through group III nitride semiconductor layers 303a, 303b, and 303c, and through contact regions 317 to source electrodes 315. By grounding gate electrode 309 (and/or by applying a negative bias to gate electrode 309), a PNP junction defined by semiconductor layers 303a, 303b, and 303c may block a path of electrical current between drain electrode 319 and source electrodes 315.

Semiconductor blocking region 307 (having P type conductivity) may provide an increased capacity for voltage blocking when the transistor is turned off. An increasing magnitude of a positive voltage applied to drain electrode 319, for example, may result in increased depletion of a reverse biased P-N junction between N type drift layer 301 and P type blocking region 307. While an N channel device is discussed by way of example, opposite conductivity types of the semiconductor layers may be used to provide a P channel device with electrodes 315 being drain electrodes and with electrode 319 being a source electrode.

As discussed above, silicon carbide semiconductor layers 321, 301, 307, and 301a may be formed using epitaxial deposition on and/or doping (e.g., implanting) of an SiC substrate/layer. Moreover, any substrate used during fabrication may be partially removed or totally removed so that only epitaxially formed layers of SiC remain. Semiconductor group III nitride channel layer 303 may be formed using epitaxial deposition on the silicon carbide layers, and patterned to expose portions of contact region 301a and/or drift layer 301. Highly doped $N^+$ type polysilicon interconnection layer 305 may be formed on exposed portions of contact region 301a and/or drift layer 301. Highly doped $N^+$ type contact regions 317 may be formed by doping (e.g., implanting) semiconductor layer 303a before patterning channel layer 303, after forming interconnection layer 305, or between patterning channel layer 303 and forming interconnection layer 305.

While not shown in FIGS. 3A and 3B, a highly doped $N^+$ type contact region of semiconductor layer 303a may provide ohmic contact between semiconductor layer 303a and polysilicon interconnection layer 305. For example, a relatively highly doped $N^+$ type contact region of semiconductor layer 303a may be provided adjacent blocking region 307, and a relatively lightly doped N type region of semiconductor layer 303a may be provided adjacent semiconductor layer 303b. Gate insulating layer 311, gate electrode 309, and source/drain electrodes 315 and 319 may be formed after forming channel layer 303 and polysilicon interconnection layer 305. According to some embodiments of the present invention, polysilicon interconnection layer 305 may be formed before forming channel layer 303.

By using highly doped $N^+$ type polysilicon for interconnection layer 305, an ohmic contact may be provided between group III nitride semiconductor layer 303a and SiC drift layer 301. Such a polysilicon interconnection layer 305 may thus be formed in the middle of the process without creating significant contamination and/or without degrading during subsequent thermal processes/operations. Stated in other words, polysilicon interconnection layer 305 may be compatible with subsequent operations used to form channel layer 303, contact regions 317, insulating layer 311, gate electrode 309, and/or source/drain electrodes 315 and/or 319.

Figure 4A:
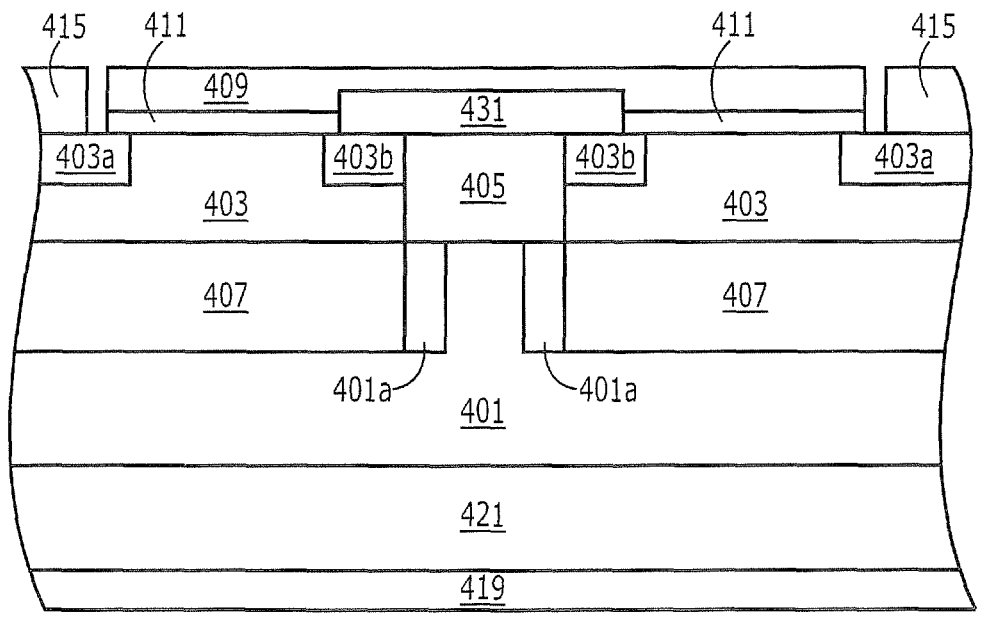
FIGS. 4A and 4B are respective cross sectional and plan views illustrating a unit cell of a vertical field effect transistor according to still other embodiments of the present invention.
Figure 4B:
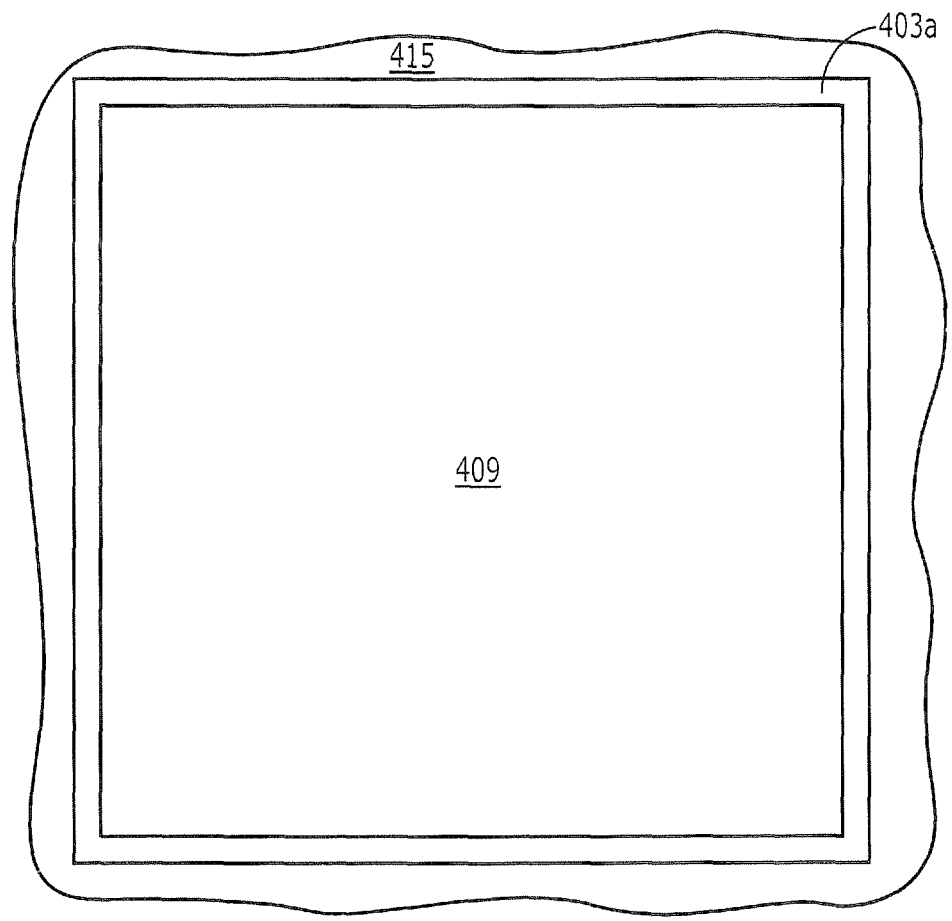

According to embodiments of the present invention illustrated in FIGS. 4A and 4B, a vertical power switching device may include a semiconductor drift layer 401 of a first semiconductor material and a semiconductor channel layer 403 of a second semiconductor material on the semiconductor drift layer 401, with the first and second semiconductor materials being different. For example, semiconductor drift layer 401 may be an epitaxially formed substantially single crystal N type SiC drift layer, and semiconductor channel layer 403 may be an epitaxially formed substantially single crystal group III nitride semiconductor layer having a conductivity type opposite that of drift layer 401. According to some embodiments, channel layer 403 may be a relatively lightly doped P type gallium nitride layer. In addition, contact regions 403a and 403b may be relatively heavily doped $N^+$ type conductivity regions defining a channel therebetween and providing ohmic contact with source/drain electrodes 415 (e.g., metal electrodes) and polysilicon interconnection layer 405, respectively. In addition, contact regions 403a and/or 403b may include relatively highly doped $N^+$ type regions to provide ohmic contact with source/drain electrodes 415 and/or polysilicon interconnection layer, and relatively lightly doped N regions to provide a desired junction with P type channel layer 403.

Semiconductor interconnection layer 405 may be a layer of a third semiconductor material, such as N type polycrystalline silicon (polysilicon), electrically coupled between semiconductor drift layer 401 and semiconductor contact region 403b. Highly doped $N^+$ type contact region 401a of semiconductor drift layer 401 may enhance electrical coupling between SiC semiconductor drift layer 401 and polysilicon interconnection layer 405. Accordingly, a dopant concentration of contact region 401a may be significantly greater than a dopant concentration of semiconductor drift layer 401. As shown in FIGS. 4A and 4B, portions of semiconductor drift layer 401 may extend between portions of contact region 401a to contact interconnection layer 405. According to other embodiments of the present invention, contact region 401a and blocking regions 407 may completely separate drift layer 401 and interconnection layer 405.

Semiconductor drift and interconnection layers 401 and 405 and contact regions 403a and 403c may have a same conductivity type (e.g., N type for an N channel device). In addition, a semiconductor blocking region 407 may be provided between semiconductor drift and channel layers 401 and 403. Moreover, semiconductor blocking region 407 and channel layer 403 may have a conductivity type (e.g., P type for an N channel device) opposite that of semiconductor drift layer 401, semiconductor interconnection layer 405, and contact regions 403a and 403b. For example, semiconductor drift layer 401, interconnection layer 405, and contact regions 403a and 403b may have N type conductivity, and semiconductor blocking region 407 and channel layer 403 may have P type conductivity. More particularly, semiconductor blocking region 407 may be a highly doped $P^+$ type layer of silicon carbide. By way of example, N type semiconductor drift layer 401 may be provided as a surface portion of an SiC substrate and/or as an eptaxially formed SiC layer, and highly doped $N^+$ type contact region 401a and highly doped $P^+$ type semiconductor blocking region 407 may be formed by doping (e.g., implanting) portions of the SiC substrate/layer including drift layer 401 with respective N and P type dopants. Semiconductor drift layer 401, semiconductor blocking region 407, and highly doped $N^+$ type contact region 401a may thus all be formed in an SiC layer(s)/substrate(s).

A relatively thin gate insulating layer 411 (e.g., a silicon oxide layer, a silicon nitride layer, etc.) may be provided on portions of channel layer 403 between contact regions 403a and 403b, and a gate electrode 409 (e.g., a metal and/or doped polysilicon electrode) may be provided on gate insulating layer 411 opposite channel layer 403. More particularly, gate insulating layer 411 and gate electrode 409 may be provided adjacent P type channel layer 403 to modulate a conductivity through surface portions of P type channel layer 403 between N type contact regions 303a and 303b responsive to an electrical signal applied to gate electrode 409. The transistor of FIGS. 4A and 4B may be normally off, and a positive bias may be applied to gate electrode 409 to generate an N type conductivity channel along a surface of P type channel layer 403 (adjacent gate electrode 409) between N type contact regions 403a and 403b to thereby turn the transistor on. Surface portions of P type channel layer 403 may thus serve as a channel region between N type contact regions 403a and 403b serving as source/drain regions of a planar MOS (Metal Oxide Semiconductor) transistor structure. In addition, a relatively thick insulating layer 431 (e.g., a silicon oxide layer, a silicon nitride layer, etc.) may separate gate electrode 409 and polysilicon interconnection layer 405.

Relatively highly doped N$^+$ source contact regions 403a may provide ohmic contact with source/drain electrodes 415. In addition, source/drain electrode 419 (e.g., a metal electrode) may be provided on semiconductor drift layer 401 opposite source/drain electrodes 415 so that a vertical conduction path is defined between source/drain electrodes 415 and source/drain electrode as 419. Accordingly, an electrical signal applied to gate electrode 409 may be used to modulate an electrical conductivity and thus an electrical current between source/drain electrodes 415 and source/drain electrodes 419.

In addition, a highly doped N$^-$ type semiconductor contact layer 421 may be provided between semiconductor drift layer 401 and source/drain electrode 419 to provide ohmic contact with source/drain electrode 419. Contact layer 421 may be formed by doping (e.g., implanting) dopants into a back side of SiC drift layer 401. According to other embodiments of the present invention, N$^+$ type semiconductor contact layer 421 may be an N+ type SiC substrate, and drift layer 401 may be epitaxially formed on contact layer 421. According to other embodiments of the present invention, contact layer 421 may be a highly doped P$^+$ type semiconductor layer.

In an N-channel device as discussed above (with N type contact regions 403a and 403b, interconnection layer 405, and drift layer 401), for example, electrodes 415 may be source electrodes, and electrode 419 may be a drain electrode. Moreover, a positive voltage may be applied to drain electrode 419 and source electrodes 415 may be grounded. By applying a positive bias to gate electrode 409, an electrical current may flow from drain electrode 419 through SiC semiconductor layers 421, 401, 401a, through polysilicon interconnection layer 405, and through group III nitride semiconductor layers 403, 403a, and 403b, to source electrodes 415. By grounding gate electrode 409 (and/or by applying a negative bias to gate electrode 409), a PNP junction defined by contact region 403a, channel layer 403, and contact region 403b may block a path of electrical current between drain electrode 419 and source electrodes 415.

Semiconductor blocking region 407 (having P type conductivity) may provide an increased capacity for voltage blocking when the transistor is turned off. An increasing magnitude of a positive voltage applied to drain electrode 419, for example, may result in increased depletion of a reverse biased P-N junction between N type drift layer 401 and P type blocking region 407. While an N channel device is discussed by way of example, opposite conductivity types of the semiconductor layers may be used to provide a P channel device with electrodes 415 being drain electrodes and with electrode 419 being a source electrode.

As discussed above, silicon carbide semiconductor layers 421, 401, 407, and 401a may be formed using epitaxial deposition on and/or doping (e.g., implanting) of an SiC substrate/layer. Moreover, any substrate used during fabrication may be partially removed or totally removed so that only epitaxially formed layers of SiC remain. Semiconductor group III nitride channel layer 303 may be formed using epitaxial deposition on the silicon carbide layers, and patterned to expose portions of contact region 401a and/or drift layer 401. Highly doped N$^+$ type polysilicon interconnection layer 405 may be formed on exposed portions of contact region 401a and/or drift layer 401. Highly doped N$^+$ type contact regions 403a and 403b may be formed by doping (e.g., implanting) semiconductor layer 403 before patterning channel layer 403, after forming interconnection layer 405, or between patterning channel layer 403 and forming interconnection layer 405.

Gate insulating layer 411, insulating layer 431, gate electrode 409, and source/drain electrodes 415 and 419 may be formed after forming channel layer 403 and polysilicon interconnection layer 405. According to some embodiments of the present invention, polysilicon interconnection layer 405 may be formed before forming channel layer 403.

By using highly doped N$^+$ type polysilicon for interconnection layer 405, an ohmic contact may be provided between group III nitride semiconductor layer 403a and SiC drift layer 401. Such a polysilicon interconnection layer 405 may thus be formed in the middle of the process without creating significant contamination and/or without degrading during subsequent thermal processes/operations. Stated in other words, polysilicon interconnection layer 405 may be compatible with subsequent operations used to form channel layer 403, contact regions 403a and 403b, insulating layer 411, gate electrode 409, and/or source/drain electrodes 415 and/or 419.

According to embodiments of the present invention, channel mobility may be increased (relative to that of an inversion channel layer in an SiC metal oxide semiconductor field effect transistor) by using a group III nitride semiconductor channel layer. Accordingly, an on resistance may be reduced and transconductance may be improved. By providing a drift layer of a wide bandgap semiconductor material such as silicon carbide, a high voltage blocking capacity may be improved, a switching speed may be increased, and/or high temperature operating capabilities may be improved.

In each of FIGS. 1A and 1B, FIGS. 3A and 3B, and FIGS. 4A and 4B, a single unit cell is shown for ease of illustration. It will be understood, however, that a transistor according to embodiments of the present invention may include a plurality of unit cells (arranged in rows and columns) on a single substrate with the plurality of unit cells sharing a same drain electrode, a same drift layer, a same blocking region, and a same channel layer, and with the plurality of unit cells having electrically coupled gate electrodes. By providing a plurality of such electrically parallel unit cells in a single device, a current capacity may be increase. Moreover, the channel layer may surround the polysilicon interconnection layer of each unit cell, and the blocking region may surround the contact portion of the drift layer of each unit cell. Stated in other words, the cross sectional views of FIGS. 1A, 3A, and 4A may illustrate both horizontal and vertical cross sectional views of center portions of respective plan views of FIGS. 1B, 3B, and 4B.

As used herein, the term vertical refers to a direction of current flow between opposite surfaces of the transistor. In a vertical field effect transistor, for example, source and drain electrodes are provided on opposite surfaces of the transistor. In contrast, source, drain, and gate electrodes of a horizontal field effect transistor are all on a same surface of the device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A transistor comprising:
    a semiconductor drift layer of a first semiconductor material;
    a semiconductor channel layer on the semiconductor drift layer wherein the semiconductor channel layer comprises a second semiconductor material;
    an interconnection layer electrically coupled between the semiconductor drift layer and the semiconductor channel layer, wherein the interconnection layer comprises a third material; and
    a control electrode on the semiconductor channel layer;
    wherein the third material comprises polycrystalline silicon.

2. A transistor according to claim 1 wherein the first and second semiconductor materials comprise substantially single crystal semiconductor materials.

3. A transistor according to claim 1 wherein the interconnection layer comprises a semiconductor interconnection layer and wherein the semiconductor drift and interconnection layers have a first conductivity type, the transistor further comprising:
    a semiconductor blocking region between the semiconductor channel and drift layers wherein the semiconductor blocking region has a second conductivity type different than the first conductivity type.

4. A transistor according to claim 3 wherein the semiconductor drift layer and blocking region comprise the first semiconductor material.

5. A transistor according to claim 3 wherein a portion of the semiconductor drift layer is free of the semiconductor blocking region and wherein the interconnection layer is electrically coupled between the semiconductor channel layer and the portion of the semiconductor drift layer that is free of the semiconductor blocking region.

6. A transistor according to claim 1 wherein the semiconductor channel layer includes a stack of semiconductor layers defining a heterojunction to provide a two dimensional electron gas (2DEG), wherein the semiconductor channel layer is between the control electrode and the drift layer, and wherein the control electrode is configured to modulate a conductivity of the two dimensional electron gas responsive to an electrical signal applied to the control electrode.

7. A transistor according to claim 1 wherein the semiconductor drift layer has a first conductivity type, wherein the semiconductor channel layer includes first, second, and third semiconductor layers, wherein the first and third semiconductor layers have the first conductivity type, wherein the second semiconductor layer has a second conductivity type different than the first conductivity type, wherein the second semiconductor layer is between the first and third semiconductor layers, wherein the first semiconductor layer is between the second semiconductor layer and the semiconductor drift layer, wherein the first semiconductor layer is electrically coupled to the interconnection layer, wherein the control electrode is adjacent an edge of the second semiconductor layer, and wherein the control electrode is configured to modulate a conductivity of the second semiconductor layer responsive to an electrical signal applied to the control electrode.

8. A transistor according to claim 1 wherein the semiconductor drift layer has a first conductivity type, wherein the channel layer includes a bulk region having a second conductivity type different than the first conductivity type and first and second spaced apart contact regions having the first conductivity type, wherein the second contact region is electrically coupled to the interconnection layer, wherein the control electrode is adjacent the bulk region between the first and second contact regions, and wherein the control electrode is configured to modulate a conductivity of the bulk region responsive to an electrical signal applied to the control electrode.

9. A transistor according to claim 1 further comprising:
    a first controlled electrode electrically coupled to a portion of the semiconductor channel layer spaced apart from the interconnection layer; and
    a second controlled electrode electrically coupled to the semiconductor drift layer,
    wherein the control electrode is configured to modulate an electrical conductivity of the channel layer responsive to an electrical signal applied to the control electrode.

10. A transistor according to claim 9 wherein an electrical current path is defined between the first and second controlled electrodes through the semiconductor channel layer, the interconnection layer, and the semiconductor drift layer responsive to an electrical signal applied to the control electrode.

11. A transistor according to claim 9 wherein the semiconductor drift layer is between the first and second controlled electrodes.

12. A transistor according to claim 1 wherein a portion of the semiconductor drift layer is free of the semiconductor channel layer, and wherein the interconnection layer is on the portion of the semiconductor drift layer that is free of the semiconductor channel layer.

13. A transistor according to claim 1 wherein the first semiconductor material comprises silicon carbide, and wherein the second semiconductor material comprises a group III nitride.

14. A transistor according to claim 1 wherein the interconnection layer comprises a semiconductor interconnection layer, wherein the semiconductor channel layer includes a highly doped contact region electrically coupled to the semiconductor interconnection layer, and wherein the highly doped contact region, the semiconductor interconnection layer, and the semiconductor drift layer have a same conductivity type.

15. A transistor according to claim 1 further comprising:
    a semiconductor contact region of the first semiconductor material between the semiconductor drift and interconnection layers, wherein the semiconductor drift layer and the semiconductor contact region have a same conductivity type, and wherein a dopant concentration of the semiconductor contact region is greater than a dopant concentration of the semiconductor drift layer.

16. A transistor according to claim 1 wherein the second semiconductor material is different than the first semiconductor material, and the third material is different than the first and second semiconductor materials.

17. A transistor according to claim 1 wherein portions of the interconnection layer including the polycrystalline semiconductor material are in a path of current flow between the semiconductor channel layer and the semiconductor drift layer.

18. A transistor comprising:
a semiconductor drift layer of a first semiconductor material;
a semiconductor channel layer on the semiconductor drift layer wherein the semiconductor channel layer comprises a second semiconductor material;
an interconnection layer electrically coupled between the semiconductor drift layer and the semiconductor channel layer, wherein the interconnection layer comprises a third material; and
a control electrode on the semiconductor channel layer;
wherein the first semiconductor material comprises silicon carbide, wherein the second semiconductor material comprises a group III nitride, and wherein the third material comprises silicon.

19. A transistor according to claim 18 wherein the second semiconductor material is different than the first semiconductor material, and the third material is different than the first and second semiconductor materials.

20. A transistor comprising:
a semiconductor drift layer of a first semiconductor material;
a semiconductor channel layer on the semiconductor drift layer wherein the semiconductor channel layer comprises a second semiconductor material;
an interconnection layer electrically coupled between the semiconductor drift layer and the semiconductor channel layer, wherein the interconnection layer comprises a third material; and
a control electrode on the semiconductor channel layer;
wherein the interconnection layer comprises a semiconductor interconnection layer, wherein the semiconductor channel layer includes a highly doped contact region electrically coupled to the semiconductor interconnection layer, wherein the highly doped contact region, the semiconductor interconnection layer, and the semiconductor drift layer have a same conductivity type, wherein the highly doped contact region is electrically coupled between the semiconductor interconnection layer and portions of the semiconductor channel layer, and wherein portions of the highly doped contact region are physically located between portions of the semiconductor interconnection layer and portions of the semiconductor channel layer.

21. A transistor according to claim 20 wherein the second semiconductor material is different than the first semiconductor material, and the third material is different than the first and second semiconductor materials.

22. A transistor according to claim 20 wherein the third material is different than the first and second semiconductor materials.

23. A transistor comprising:
a semiconductor drift layer of a first semiconductor material;
a semiconductor channel layer on the semiconductor drift layer wherein the semiconductor channel layer comprises a second semiconductor material;
an interconnection layer electrically coupled between the semiconductor drift layer and the semiconductor channel layer, wherein the interconnection layer comprises a third material;
a control electrode on the semiconductor channel layer; and
a semiconductor contact region of the first semiconductor material between the semiconductor drift and interconnection layers, wherein the semiconductor drift layer and the semiconductor contact region have a same conductivity type, wherein a dopant concentration of the semiconductor contact region is greater than a dopant concentration of the semiconductor drift layer, and wherein the first and third materials are different;
wherein an interface between the interconnection layer and the semiconductor drift layer is a direct interface between the first and third materials, and wherein a width of the interface between the interconnection layer and the semiconductor drift layer in a direction parallel to the interface is less than a greatest width of the drift layer in the direction parallel to the interface.

24. A transistor according to claim 23 wherein the second semiconductor material is different than the first semiconductor material, and the third material is different than the first and second semiconductor materials.

25. A transistor comprising:
a semiconductor drift layer of a first semiconductor material and having a first conductivity type;
a semiconductor blocking region on the semiconductor drift layer wherein the semiconductor blocking region has a second conductivity type different than the first conductivity type;
a semiconductor channel layer on the semiconductor blocking region wherein the semiconductor channel layer comprises a second semiconductor material, and wherein the semiconductor blocking region is between the semiconductor drift and channel layers;
an interconnection layer electrically connected between the semiconductor drift layer and the semiconductor channel layer, and wherein the interconnection layer comprises a third material;
a first controlled electrode electrically coupled to a portion of the semiconductor channel layer spaced apart from the semiconductor interconnection layer;
a second controlled electrode electrically coupled to the semiconductor drift layer; and
a control electrode on the semiconductor channel layer between the first controlled electrode and the interconnection layer wherein the control electrode is configured to modulate an electrical conductivity of the channel layer responsive to an electrical signal applied to the control electrode;
wherein the third material comprises polycrystalline silicon.

26. A transistor according to claim 25 wherein the semiconductor channel layer includes a stack of semiconductor layers defining a heterojunction to provide a two dimensional electron gas (2DEG), wherein the control electrode is configured to modulate a conductivity of the two dimensional electron gas responsive to an electrical signal applied to the control electrode.

27. A transistor according to claim 25 wherein the semiconductor drift layer has a first conductivity type, wherein the semiconductor channel layer includes first, second, and third semiconductor layers, wherein the first and third semiconductor layers have the first conductivity type, wherein the second semiconductor layer has a second conductivity type different than the first conductivity type, wherein the second semiconductor layer is between the first and third semiconductor layers, wherein the first semiconductor layer is between the second semiconductor layer and the semiconductor drift layer, and wherein the first semiconductor layer is electrically coupled to the interconnection layer, and wherein the control electrode is configured to modulate a conductivity of the second semiconductor layer responsive to an electrical signal applied to the control electrode.

28. A transistor according to claim 25 wherein the channel layer includes a bulk region having the second conductivity type and first and second spaced apart contact regions having the first conductivity type, wherein the second contact region is electrically coupled to the interconnection layer, and wherein the control electrode is configured to modulate a conductivity of the bulk region responsive to an electrical signal applied to the control electrode.

29. A transistor according to claim 25 wherein the semiconductor drift layer is between the first and second controlled electrodes, and wherein an electrical current path is defined between the first and second controlled electrodes through the semiconductor channel layer, the interconnection layer, and the drift layer responsive to an electrical signal applied to the control electrode.

30. A transistor according to claim 25 wherein a portion of the semiconductor drift layer is free of the semiconductor blocking region and is free of the semiconductor channel layer, and wherein the interconnection layer is on the portion of the semiconductor drift layer that is free of the semiconductor blocking regions and that is free of the semiconductor channel layer.

31. A transistor according to claim 25 wherein the semiconductor drift layer is between the first and second controlled electrodes.

32. A transistor according to claim 25 wherein the second semiconductor material is different than the first semiconductor material, and the third material is different than the first and second semiconductor materials.

33. A transistor according to claim 25 wherein portions of the interconnection layer including the polycrystalline semiconductor material are in a path of current flow between the semiconductor channel layer and the semiconductor drift layer.

34. A transistor according to claim 25 wherein the first semiconductor material comprises silicon carbide, and wherein the second semiconductor material comprises a group III nitride.

35. A transistor comprising:
a silicon carbide drift layer wherein the silicon carbide drift layer has a first conductivity type;
a group III nitride channel layer on the silicon carbide drift layer;
a first controlled electrode electrically coupled to a portion of the group III nitride channel layer;
a second controlled electrode electrically coupled to the silicon carbide drift layer;
a control electrode on the group III nitride channel layer;
a semiconductor blocking region between the silicon carbide drift layer and the group III nitride channel layer wherein the semiconductor blocking region has a second conductivity type different than the first conductivity type; and
an interconnection layer electrically connected between the silicon carbide drift layer and the group III nitride channel layer, wherein the interconnection layer comprises a material different than the group III nitride of the group III nitride channel layer and different than silicon carbide;
wherein the semiconductor blocking region comprises a silicon carbide blocking region, and wherein the interconnection layer comprises a polycrystalline semiconductor material.

36. A transistor according to claim 35 wherein the silicon carbide drift layer is between the first and second controlled electrodes.

37. A high electron mobility transistor (HEMT) comprising:
a semiconductor drift layer, wherein the semiconductor drift layer comprises a silicon carbide drift layer;
a semiconductor channel layer on the semiconductor drift layer, wherein the semiconductor channel layer includes a stack of semiconductor layers defining a heterojunction to provide a two dimensional electron gas, wherein the semiconductor channel layer comprises a group III nitride channel layer;
a first controlled electrode electrically coupled to a portion of the semiconductor channel layer;
a second controlled electrode electrically coupled to the semiconductor drift layer;
a control electrode on the semiconductor channel layer, wherein the control electrode is configured to modulate a conductivity of the two dimensional electron gas responsive to an electrical signal applied to the control electrode; and
a silicon interconnection layer electrically connected between the group III nitride channel layer and the silicon carbide drift layer.

38. A HEMT according to claim 37 wherein the silicon interconnection layer comprises a polycrystalline interconnection layer.

39. A HEMT according to claim 37 further comprising:
a silicon carbide blocking region between the silicon carbide drift layer and the group III nitride channel layer, wherein the silicon carbide blocking region and the silicon carbide drift layer have opposite conductivity types.

40. A HEMT according to claim 37 wherein the silicon interconnection layer and the silicon carbide drift layer have a same conductivity type.

41. A high electron mobility transistor (HEMT) according to claim 37 wherein the semiconductor drift layer is between the first and second controlled electrodes.

* * * * *